United States Patent [19]

Shah et al.

[11] 4,390,885
[45] Jun. 28, 1983

[54] APPARATUS AND METHOD FOR FLUID TRANSFER

[75] Inventors: Gautam N. Shah, Garland; Michael R. Brown, Plano; Edward C. Lee, Dallas; Gerald C. Hook, Garland; Robert L. Wand, Richardson; Charles R. Ratliff, Richardson; Virge W. McClure, Richardson, all of Tex.

[73] Assignee: Texas Instruments Incorporated, Dallas, Tex.

[21] Appl. No.: 277,584

[22] Filed: Jun. 26, 1981

[51] Int. Cl.³ .................. G01D 15/18; G01D 9/00
[52] U.S. Cl. .................. 346/140 R; 346/1.1; 346/33 F
[58] Field of Search ........... 346/75, 1.1, 140, 141, 346/33 F

[56] References Cited

U.S. PATENT DOCUMENTS

| | | | |
|---|---|---|---|
| 3,805,276 | 4/1974 | Ishill | 346/140 |
| 3,943,527 | 3/1976 | Hartmann | 346/33 F |
| 4,195,259 | 3/1980 | Reid et al. | 324/158 P |
| 4,219,771 | 8/1980 | Reid et al. | 324/158 P |

OTHER PUBLICATIONS

I.B.M Technical Disclosure Bulletin, vol. 6, No. 9, Feb. 1964, pp. 53–54.

Primary Examiner—Donald A. Griffin
Attorney, Agent, or Firm—Thomas W. Demond; Rich Donaldson; Melvin Sharp

[57] ABSTRACT

An apparatus having a reservoir for enclosing a fluid and a valve for selectively applying gas under pressure to said reservoir and venting said reservoir to the ambient air. A controller supplies a pulse of predetermined duration selected from a plurality of durations to actuate the valve to apply the gas under pressure to the reservoir for expelling a predetermined amount of ink therefrom through a tube by compensation for dynamic effects. The ink is transferred from one end of the tube to a selected item of a sheet of items by moving the end of the tube closely adjacent to the sheet while the ink is being expelled from the reservoir and through the tube for transfer to the individual item.

10 Claims, 7 Drawing Figures

APPARATUS AND METHOD FOR FLUID TRANSFER

BACKGROUND OF THE INVENTION

1. Field of the Invention

This invention relates to apparatus for transferring fluids and more particularly, this invention relates to apparatus for transferring ink utilizing air pressure.

2. Description of the Prior Art

During the processing of semiconductor devices, it is desirable to locate the individual devices on a semiconductor wafer which are defective. The individual devices, which are found to be defective, are marked with an ink dot and disposed of after the wafer is sliced to separate the individual devices. By disposing of the defective individual devices at this stage considerable cost savings and efficiencies are obtained because the defective devices are not packaged and then found defective. The devices are determined to be defective by an automatic tester called the prober. The tester, after determining that a particular individual device is defective, issues a signal to the inker which applies an ink dot to that individual device.

The prior inkers include a device having a stiff plastic line which is attached at one end to the moveable arm of a solenoid. From its attachment to the solenoid the line extends through a reservoir of ink and a hollow metal tube. When the solenoid is actuated, the end of the line adjacent to the end of the cylinder extends to contact the wafer at an individual defective device. When the solenoid is actuated, the line extending through the hollow metal tube utilizes wetting action and gravity to transfer ink from the interior of the hollow metal tube and thus the ink is transferred to the individual device. The ink with the hollow metal tube is resupplied by gravity from the reservoir. Although this type of inker functions, it does not provide uniform ink dots on the individual semiconductor devices. Further, the ink is exposed to the ambient air and drying can thereby occur. As the cost of processing semiconductor devices increases and with the introduction of more automated packaging equipment, it was desirable that a more dependable inker be developed which provided higher reliability and a more uniform ink dot size. It was also desirable that an inker be provided which had increased reliability eliminating intermittent failures.

None of the prior constructions known utilizes a pneumatic system for application of ink to mark individual semiconductor devices on a wafer. Further, none of the prior constructions shows utilizing a variable pulse of gas under pressure to a pneumatic system for expelling a predetermined amount of fluid.

SUMMARY OF THE INVENTION

The apparatus of the present invention includes a gas supply which is capable of providing gas at a known regulated pressure. The gas supply is pneumatically connected to a three-way solenoid valve. The solenoid valve is also connected to a vent and an inker. A controller supplies the solenoid valve with an appropriate actuation signal. The controller also provides a signal for actuation of a solenoid within the inker. The inker is physically located adjacent a sheet which can be, for example, a wafer of semiconductor material. The reservoir of the inker is pneumatically connected to the solenoid valve. The solenoid valve as discussed above selectively, when actuated, connects gas under pressure to the reservoir and when deactuated connects the reservoir of the inker to the vent. The pressure of the vent is at or slightly below the ambient air pressure. The pressure of the gas from the gas supply is above the ambient air pressure.

The reservoir of the inker contains a fluid which can be, for example, ink. One end of a flexible tube, which can be, for example, made from polyvinylidenefluoride, has one end extending through the reservoir into the cavity thereof. The end of the tube within the cavity is disposed beneath the surface of the ink near the bottom of the cavity. The cavity of the reservoir is completely enclosed by the reservoir and is hermetically sealed; however, the cavity is pneumatically in communication with the solenoid valve. The ink in the cavity is in hydraulic communication with the hollow interior of the tube. The tube extends through an opening in the reservoir and has a hermetic seal therewith.

The reservoir is rigidly fixed to a support which also has the solenoid attached thereto. The support is rigidly connected to a frame which also supports a table which is capable of angular and X-Y movement. The semiconductor wafer is disposed on the table. Also attached to the support is a cylinder which extends outward therefrom toward the wafer. The end of the tube away from the end within the cavity passes through the cylinder and is located adjacent the end of the cylinder close to the wafer. The solenoid has its moveable arm attached to the flexible tube close to the entry of the tube into the cylindrical cylinder. When the controller actuates the solenoid within the inker, the end of the flexible tube is moved to a location very close to the surface of the individual device to be marked. At the same time, the solenoid valve applies gas under pressure to the cavity of the ink reservoir which forces ink from the reservoir through the flexible tube and out the end of the tube adjacent the wafer. The ink is transferred to the individual device to be marked because the end of the tube is close to the surface of the wafer and the ink extends beyond the end of the tube for engagement with the wafer. The solenoid of the inker is then deactuated and the flexible tube is moved away from the wafer. The solenoid valve is also deactuated, although not simultaneously with deactuation of the solenoid of the inker. The cavity is then pneumatically connected to the vent by the valve. This reduces the air pressure within the cavity rapidly and prevents additional ink from being deposited upon the wafer.

It is an advantage of the present invention to utilize a pneumatic system for application of ink to a semiconductor wafer.

It is a further advantage of the present invention to provide a variable pulse width to a solenoid valve in order to overcome dynamic effects produced by movement of a fluid.

An additional advantage of the present invention is to provide control of the amount of fluid expelled from a reservoir by determining the precise amount of fluid expelled and altering the duration of the application of gas under pressure to the reservoir, which controls the amount of fluid expelled.

It is an advantage of the present invention to provide the positive expulsion of ink from a reservoir utilizing a pneumatic system.

It is also an advantage of the present invention to reduce intermittent failures by providing the positive expulsion of ink in the reservoir.

Another and further advantage of the present invention is to provide for the transfer of a uniform amount of ink to a semiconductor wafer.

It is another advantage of the present invention to reduce drying of the ink within the reservoir by not exposing the ink to the atmosphere.

DESCRIPTION OF THE PREFERRED EMBODIMENT

Figure 1:
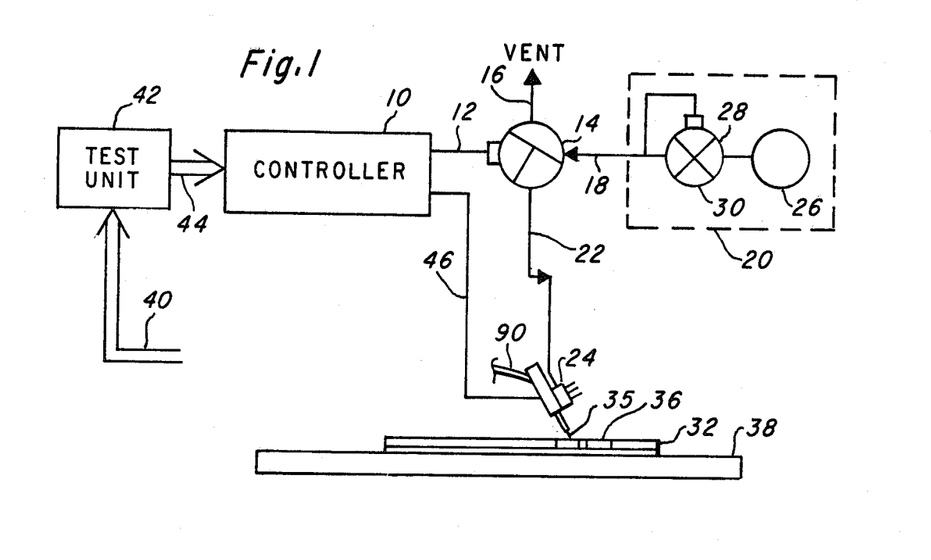
FIG. 1 is a schematic diagram, partly mechanical and partly electrical, illustrating the general operation of the system embodying the present invention.

With reference to the drawings and in particular to FIG. 1 thereof, a controller 10 is connected through line 12 to a three-way solenoid valve 14. Controller 10 actuates valve 14 through line 12. The valve is in pneumatic communication through conduit 16 to a vent, conduit 18 to a gas supply 20 and through conduit 22 to inker 24. Gas supply 20 includes a compressor 26 which supplies gas under pressure and a pressure regulator 28. The pressurized gas provided by compressor 26 is connected through conduit 30 to pressure regulator 28. Pressure regulator 28 maintains an approximately uniform pressure at its output connected to conduit 18.

The inker 24 is disposed adjacent to a wafer 32 (however, the wafer 32 is by way of example only and any sheet upon which individual items exist can be utilized). Wafer 32 is comprised of a plurality of individual devices (only individual devices 35 and 36 are shown in FIG. 1). The wafer 32 is disposed upon a moveable table 38 which is capable of angular and X-Y directional movement. Each individual device of wafer 32 is contacted by a probe (not shown) through multi-line channel 40 to a test unit 42. The probe and related test unit is described in the copending patent application by Bucy et al., Ser. No. 53,470, filed on June 29, 1979, and entitled "Active Probe for Use in an Electrical Circuit Testing", U.S. Pat. No. 4,219,771 by Reid et al., granted Aug. 26, 1980 and entitled "Four Quadrant, Multiprobe-Edge Sensor for Semiconductor Wafer Probing", and U.S. Pat. No. 4,195,259 by Reid et al. granted Mar. 25, 1980 and entitled "Multiprobe Test System and Method of Using Same", which are incorporated by reference thereinto. The test unit 42 is connected through line 44 to controller 10 for actuation thereof. The detailed function of the controller 10 is discussed hereinafter with reference to FIG. 4. Controller 10 has an output connected through line 46 to a solenoid 48 (FIG. 5) on inker 24.

Figure 2:
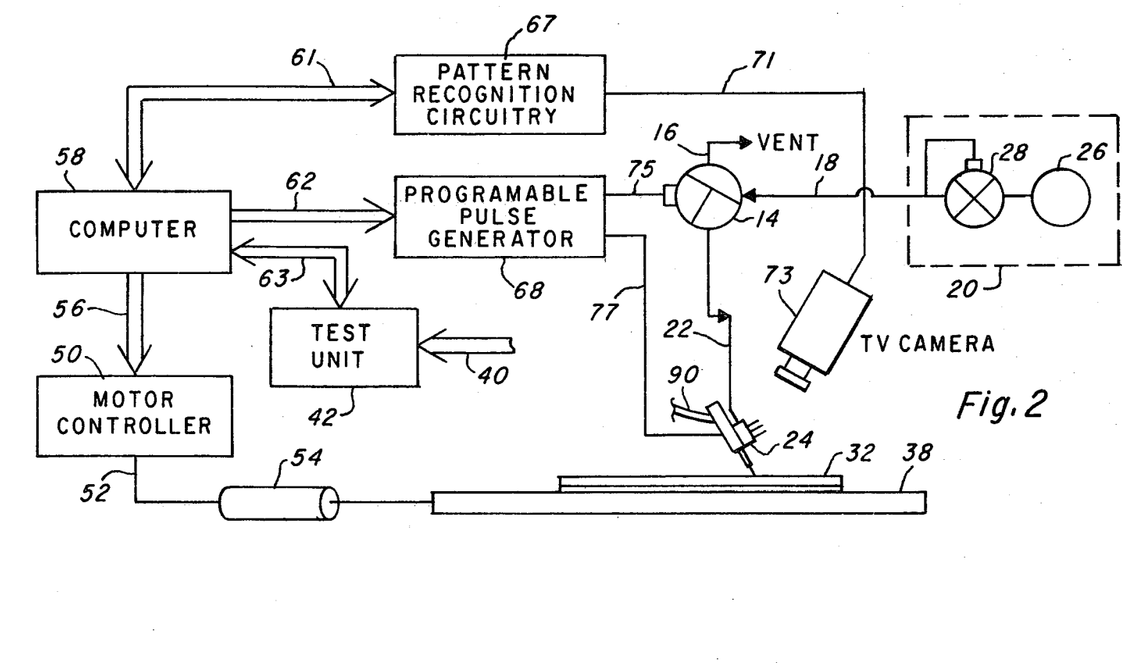
FIG. 2 is a schematic diagram partly mechanical and partly electrical, illustrating the general operation of a second system embodying the present invention.

Another embodiment of the present invention is shown in FIG. 2. The gas supply 20, valve 14, table 38 and test unit 42 operate in the same manner as in FIG. 1. In addition, the motor controller 50, which is also required with the system shown in FIG. 1, is shown connected through line 52 to a motor 54 which is one of several motors for movement of table 38. Motor controller 50 is connected through multi-line channel 56 to digital computer 58. Computer 58 is also connected through multi-line channels 61, 62, and 63 to a pattern recognition circuitry 67, a programmable pulse generator 68, and test unit 42, respectively.

Pattern recognition circuitry 67 is connected through line 71 to the output of a TV camera 73. The TV camera is disposed to focus on the individual device which is to have ink transferred thereto by inker 24. The pattern recognition circuitry 67 determines if the ink dot is of the proper size and so informs computer 50 through multi-line channel 61. If the ink dot produced by inker 24 is of an improper size, computer 58 through channel 62 so informs programmable pulse generator 68 to alter the duration of the pulse provided to valve 14 through line 75 as appropriate. The programmable pulse generator 68 is also connected through line 77 to the solenoid 48 (FIG. 5) of inker 24. Programmable pulse generator 68 is capable of responding to computer 58 by altering the duration of the pulse provided to valve 14 through line 75. In order to provide a larger dot size, i.e., increase the amount of ink transferred by inker 24 to the wafer 32 the duration of the pulse to valve 14 is increased. Test unit 42 in FIG. 2 is shown as receiving its inputs from a prober (not shown) through channel 40 as discussed above.

In FIGS. 1 and 2, conduit 16 is shown connected to a vent. The vent provides a pressure which is slightly below or equal to the ambient air pressure.

Figure 4:
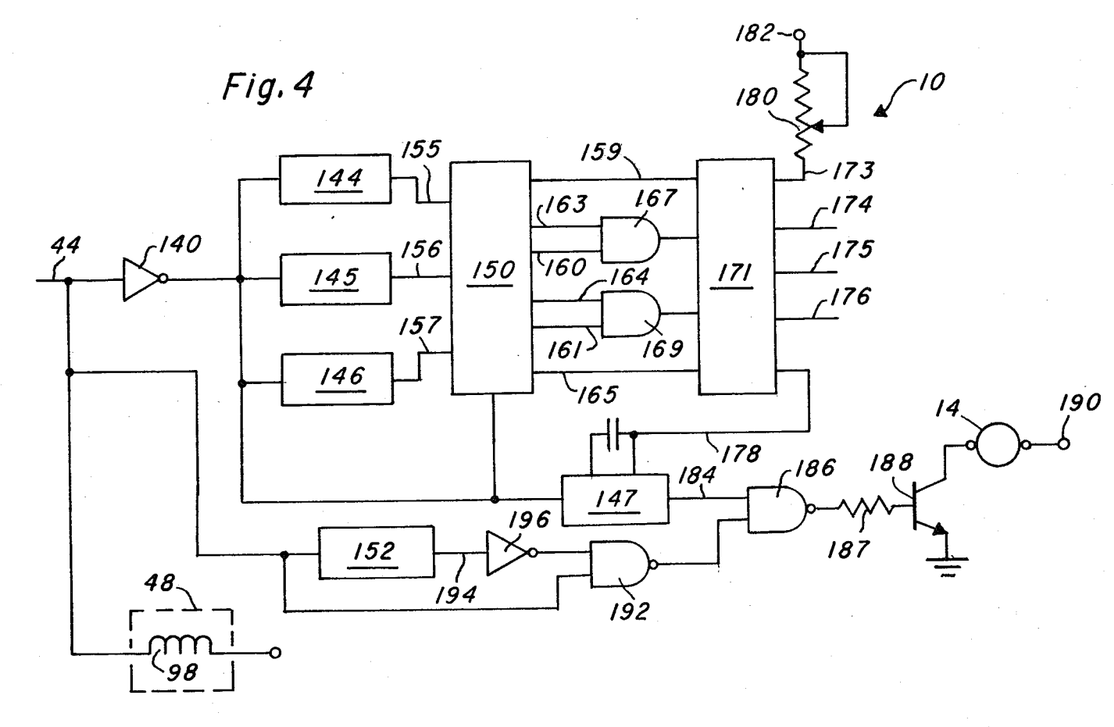
FIG. 4 is a block diagram of the controller of FIG. 1.
Figure 5:
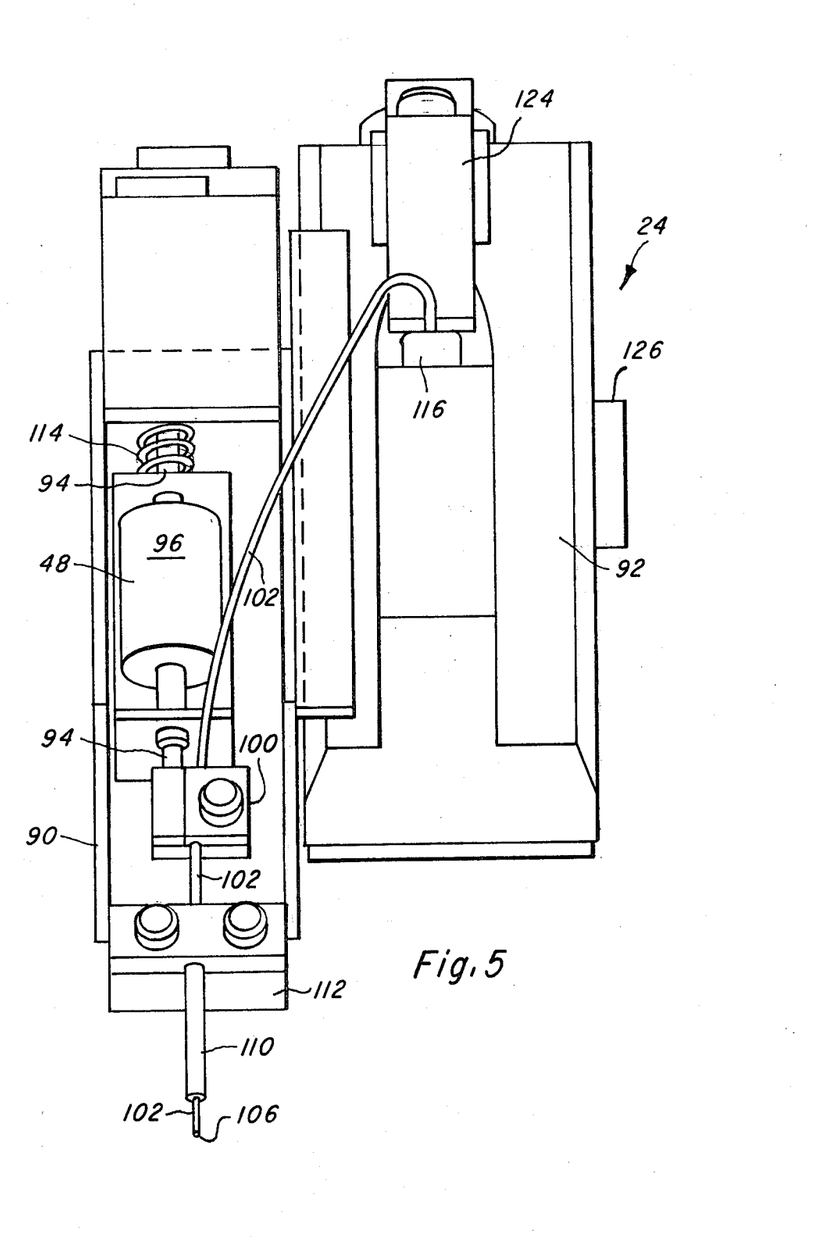
FIG. 5 is a front view of the inker of FIGS. 1 and 2 embodying the present invention.
Figures 6, 7:
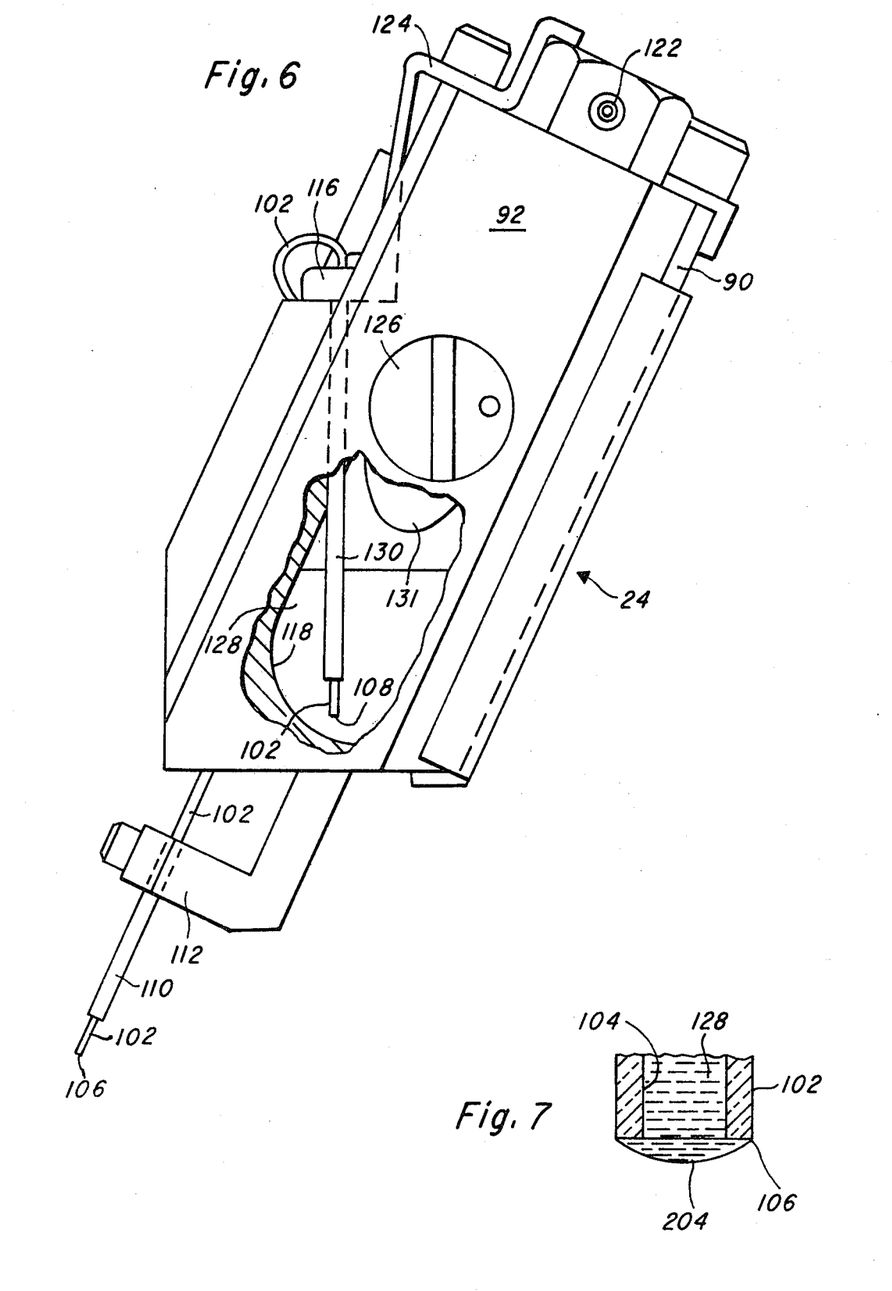
FIG. 6 is a side view of the inker shown in FIG. 5 with portions broken away to reveal its internal structure.
FIG. 7 shows a convex meniscus of fluid at the end of a tube in cross section.

FIGS. 5 and 6 show the details of the inker 24 of FIGS. 1 and 2. The major components of inker 24 are the solenoid 48, the support 90, and reservoir 92. Solenoid 48, which is rigidly attached to support 90, has a moveable arm 94 extending longitudinally outward therefrom. Arm 94 extends completely through the housing 96 of solenoid 48 in which is disposed a coil 98 (FIG. 4). When current passes through coil 98, movable arm 94 is driven downward (as shown in FIG. 5). A clamp 100 is affixed to the lower end of arm 94 away from housing 96. A flexible tube 102 is clamped therein.

The tube 102 is held by clamp 100 in such a way as not to close its interior opening 104. Tube 102 has an interior opening 104 (FIG. 7) which extends from one end 106 (FIG. 5) to its other opposite end 108 (FIG. 6). Tube 102 can be any flexible tube having sufficient rigidity for the functions described herein and can be, for example, constructed from polyvinylidenefluoride. From clamp 100, tube extends through a cylindrical support 110 to end 106. The tube 102 is slideably engaged with support 110. Cylindrical support 110 is attached to a nib 112 of support 90. When solenoid 48 is actuated, the movable arm 94 moves toward nit 112 which causes end 106 to move in a direction away from cylindrical support 110. When power goes off or solenoid 48 is deactuated, arm 94 which is biased upward by spring 114, pulls end 106 of tube 102 toward cylindrical support 110. End 106 is, when solenoid 48 is actuated, located closely adjacent to the individual device on wafer 32 (FIGS. 1 and 2) which is to be marked by the transfer of ink.

Flexible tube 102 extends to the upper part of reservoir 92 through a plug 116 into the cavity 118 of the reservoir 92. The plug 116 has an opening adapted to receive tube 102 and is capable of forming a hermetic seal with tube 102 without closing the opening 104

(FIG. 7). The cavity 118 of reservoir 92 is hermetically sealed except for opening 104 through end 108 of tube 102 and the connection through opening 122 to conduit 22 (FIGS. 1 and 2). Reservoir 92 is rigidly affixed to support 90. A bracket 124 is connected to reservoir 92 for holding plug 116 at its desired location. A filler cap 126 into cavity 118 is also provided on reservoir 92 for filling the ink in the cavity 118 when desired. Cavity 118 is partially filled with ink 128. Although ink is shown and described herein, any desired fluid can be utilized within the present invention.

Support 90 is rigidly affixed to the same frame (not shown) which supports table 38 (FIGS. 1 and 2). From plug 116 to adjacent the end 108, tube 102 is encased within a fairly rigid cylinder 130. The purpose of cylinder 130 is to insure that the end 108 of tube 102 remains adjacent to the approximate bottom of cavity 118. A flexible membrane 131 can be provided between the gas from conduit 22 and the cavity 118. When gas is provided through conduit 22, the membrane 131 expands and ink is forced through tube 102. The membrane prevents the ink from exiting cavity 118 through conduit 22, if the inker 24 is turned upside down prior to installation. The membrane also prevents the ink from drying by contact with the gas in conduit 22. When pressure is applied through conduit 22 (FIGS. 1 and 2) by the actuation of valve 14, ink 128 is forced through end 108 of tube 102 out of cavity 118. The ink expelled passes through tube 102 and is transferred at end 106 to the wafer 32 (FIGS. 1 and 2). The cavity 118 is also connected to the vent through conduit 22 and valve 14, when deactuated, in order to prevent additional ink 128 from passing through end 106 and being deposited on the wafer 32 (FIGS. 1 and 2). If the valve 14 did not connect the cavity 118 to vent, the pressure applied to the ink 118 would remain until sufficient ink is expelled to relieve the pressure. Further, the greater pressure inside cavity 118 would require a higher pressure from gas supply 20 to expel additional ink therefrom. It should be noted that in operation the valve 14 requires a time interval to disconnect the cavity 118 from the gas supply 20 and to connect the cavity 118 to the vent.

Controller 10 is shown in FIG. 4. When test unit 42 (FIG. 1) determines that a particular device of wafer 32 is defective, a negative going pulse is issued to line 44. The negative going pulse is applied to one end of coil 98 of solenoid 48. The other opposite end of coil 98 away from its connection to line 44 is connected to a positive voltage sufficient to actuate the solenoid 48. The low pulse on line 44 causes current to flow through coil 98 which actuates the solenoid. This causes arm 94 (FIG. 5) to move downward which in turn causes end 106 of tube 102 to move toward the wafer 32.

Line 44 is connected through an inverter 140 to an input of monostable multivibrators 144 through 147. The output of inverter 140 is also connected to the enable input of latch 150. The reset input of counter 152 is connected to line 44. When the negative going pulses occurs on line 44, the output of inverter 140 is a positive going pulse. A low to high transition from inverter 140 causes multivibrators 144 through 146 have their outputs go high for a length of time determined by the resistive capacitive networks attached to their respective R-C inputs. The outputs of multivibrators 144 through 146 are connected through lines 155 through 157, respectively, to latch 150. When the output of inverter 140 goes high the latch 150 transfers the inputs present on lines 155 through 157 to its outputs connected to lines 159 through 161. Latch 150 also provides the complement of the signals present on lines 159 through 161 to lines 163 through 165, respectively. Lines 160 and 163 are connected as inputs to AND gate 167, and lines 161 and 164 are connected as inputs to AND gate 169. The outputs of AND gates 167 and 169, and lines 159 and 165 are connected to a multiplexer 171. Latch 150 can be of a type designated as a 74175 and multiplexer 171 can be of a type designated as CD4016.

Multiplexer 171 is connected so that any of its inputs from lines 173 through 176 are connectable to its output on line 178. Multiplexer 171 represents a solid state switch. Line 173 is also connected through a potentiometer 180 to a constant DC voltage present on terminal 182. If the outputs of multivibrators 144 through 146 were all high when the next low to high transition of inverter 140 occurs, the multiplexer 171 connects line 178 to line 173 and the resistive value set by potentiometer 180 will control the pulse width produced by multivibrator 147. If the outputs of multivibrators 145 and 146 are high, lines 174 and 178 are connected and if the output of multivibrator 146 is high, lines 175 and 178 are connected. If the outputs of multivibrators 145-147 are low, line 176 is connected to line 178. The output of the multivibrators are as discussed above transferred through latch 150 and AND gates 171 for application to multiplexer 171.

In an example, multivibrators 144 through 145 can be set to provide pulses having durations of 133 msec, 285 msec and 3.5 seconds, respectively. Lines 174 though 176 have potentiometers similar to potentiometer 180 and are connected through those potentiometers to terminal 182. The potentiometers (only potentiometer 180 is shown) are adjusted so that if lines 173 through 176 are connected to line 178, the duration of the pulses produced by multivibrator 147 is 33 msec, 38 msec, 41 msec, and 46 msec, respectively. These values were utilized to provide a 15 mil dot with the pressure from gas supply 20 at 30 psi and the tube having an internal diameter of 10 mils and an outer diameter of 20 mils. If the duration of the pulse width is not varied, the dot size can vary by a factor of 2 due to dynamic effects because the inker operates at high speed periodically.

When multivibrator 147 is actuated by the low to high transition from inverter 140, its output to line 184 goes low and, after the time set by the resistive-capacitive values provided to its R-C inputs, goes high again. Multivibrator 147 is connected through line 184 to NAND gate 186. While the output of multivibrator 147 is low, the output of NAND gate 186 goes high. The output of NAND gate 186 is connected through resistor 187 to the base of transistor 188. The emitter of transistor 188 is connected to ground and its collector is connected to one side of the solenoid of valve 14. The other side of the solenoid of valve 14 is connected to a positive voltage on terminal 190. When the output of NAND gate 186 goes high, transistor 188 turns on and connects the positive voltage on terminal 190 to ground which causes a current flow through the solenoid of valve 14 which in turn actuates the valve 114. With reference to FIG. 1, this connects the gas from gas supply 20 to the cavity 118 (FIG. 6).

Counter 152 is provided with circuitry so that its output to line 194 goes low for 10 MS every 22 seconds unless reset. A low to high transition from inverter 140 causes the counter to reset. This low output to line 194 is connected through inverter 196 as an input to NAND gate 192 which causes it to go low. The other input to NAND gate 192 is connected to line 44. The low output of NAND gate 192 in turn causes NAND gate 186 to go high which as discussed above turns on transistor 188 actuating the valve 14. Counter 152 and NAND gates 192 and inverter 196 are provided to prevent a concave meniscus from developing at end 106 of tube 102.

The programmable pulse generator 168 can be provided by directly connecting a latch, for example, latch 150, to multiplexer 171. Various appropriate interfaces between the computer 58 and latch 150 can be provided. The various resistances on line 173–176 to multiplexer 171 can be arranged to provide 16 different appropriate selectable durations for the output pulse of multivibrator 147. Counter 152 can be eliminated if the computer provides the pulse to prevent concave meniscus from forming. Of course, the interfaces would eliminate multivibrators 144 through 146.

Figure 3:
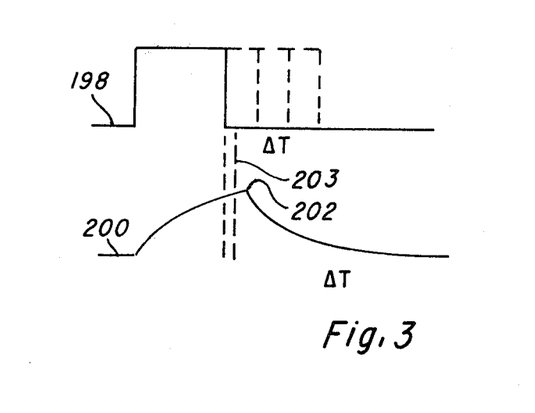
FIG. 3 shows waveforms generated within the present invention.

In FIG. 3, the output of NAND gate 186 is shown by curve 198. A pulse, for example, having a 33 msec width causes the flow of ink in tube 102 shown by curve 200. After the gas supply has been shut off and before the vent is connected to cavity 118, ink continues to accelerate until point 202. As the valve 14 opens cavity 118 to the vent, the fluid begins to decelerate. If the fluid is still slowly moving when it is desired to actuate valve 14 again, a shorter pulse width must be applied to expel the same amount of fluid from the cavity 118 and through end 106 of tube 102. In determining the duration of the pulse, other dynamic effects such as the compressibility of the gas and the elasticity and inertia of the membrane 131 can be considered. The solenoid 48 disengages end 106 of tube 106 from wafer 32 at the approximate time shown by dotted line 203 (FIG. 3). The ink which flows through tube 102 after the time shown by dotted line 203 forms a part of the meniscus 204 for the next dot to be formed.

As described in connection with FIG. 4, the controller 10 supplies a pulse with a duration which decreases as the amount of time from the last actuation increases. The dotted lines associated with curve 198 are only to represent the fact that various other durations for the pulses to line 184 can be provided.

The end 106 of tube 102 is shown in FIG. 7. The ink 128 is shown to have a convex meniscus 204 which extends beyond the 106. The meniscus 204 is formed by the application of gas by valve 14 into cavity 118. The meniscus grows and contacts the surface of wafer 32. Thus, a dot of ink is formed on the surface of wafer 32. If it is desired to form, for example, a 15 mil dot the inner diameter of the tube should be approximately 10 mils and the outer diameter of the tube should be approximately 20 mils.

Having described the invention in connection with certain specific embodiments thereof, it is to be understood that further modifications may now suggest themselves to those skilled in the art, and it is intended to cover such modification as fall within the scope of the appended claims.

What is claimed is:

1. A system for selectively applying a predetermined amount of ink to an individual item of a plurality of items forming a sheet thereof, comprising:
   (a) a reservoir having an enclosed cavity for said ink with a first and second opening into said cavity;
   (b) a pneumatic supply;
   (c) a valve connected to said pneumatic supply, ambient air, and said first opening for selectively connecting said supply in response to a first signal to said ink and ambient air to said ink;
   (d) an arm for selective movement of a first end thereof from a rest position to an inking position in response to a second signal;
   (e) a tube having one end disposed through said second opening into said ink and another end opposite to said one end thereof attached to said arm for movement to a position closely adjacent to said item;
   (f) a table having said sheet disposed thereon for positioning each item adjacent said ink position;
   (g) a controller connected to said valve and said arm for producing said first signal for a known duration to expel said predetermined amount of ink from said cavity through said tube and initiating said second signal substantially simultaneously with said first signal.

2. Apparatus for providing a predetermined amount of ink comprising:
   (a) a reservoir having an enclosed cavity for said ink and provided with a first and second openings into said cavity;
   (b) a pneumatic supply providing gas under pressure;
   (c) a valve connected to said pneumatic supply, ambient air, and said first opening for selectively connecting said cavity to said pneumatic supply to expel ink from said cavity through said second opening in response to a first signal and to ambient air for preventing additional ink from exiting said second opening; and
   (d) a controller connected to said valve and producing said first signal of a known duration selected from a plurality of known durations to expel said predetermined amount of ink.

3. A method of expelling a predetermined amount of fluid comprising the steps of:
   (a) applying a pulse of gas under pressure having a known duration to said fluid enclosed in a reservoir;
   (b) venting said fluid after step (a); and
   (c) selecting duration of next pulse following said pulse from a plurality of pulse durations utilizing time period from said pulse to said next pulse.

4. The method as set forth in claim 3 including the step of sensing amount of said fluid expelled by said pulse and altering duration of said next pulse to provide said predetermined amount.

5. An apparatus for controlling ink comprising:
   (a) a reservoir having an enclosed cavity therein for containing said ink and provided with a first and second openings into said cavity;
   (b) a flexible tube extending closely through said second opening for performing a hermetic seal therewith and having a first end located adjacent bottom of said cavity, said tube having a second end opposite to said first end thereof extending through and slightly beyond a rigid support and moveable thereagainst; and
   (c) a solenoid having an arm moveable when actuated, said arm attached to said tube adjacent said rigid support for moving said second end from a first position adjacent said support to a second position away from said support when actuated.

6. Apparatus as set forth in claim 5 including a gas supply, a valve connected to said gas supply, ambient air, and said first opening for selectively applying gas under pressure to said cavity and venting said cavity to ambient pressure.

7. Apppparatus for applying ink to a selected item on a sheet of items comprising:
(a) first means enclosing said ink;
(b) second means in communication with said ink within said first means for selectively applying preselected pressure thereto in response to a signal and releasing said preselected pressure;
(c) third means connected to said first means for receiving an amount of said ink when said preselected pressure is applied;
(d) movable fourth means connected to said third means to transfer said amount of said ink to said item in response to said signal.

8. System for applying ink to an item of a sheet of items comprising:
(a) a tester determining if a particular item of said items is defective;
(b) a gas supply;
(c) a vent maintaining a pressure at or slightly below ambient pressure;
(d) an ink reservoir enclosing said ink and having a first and second openings;
(e) a valve connected to said first opening, said gas supply, and said vent for selectively connecting gas under pressure to said ink in response to a first signal and said vent to said ink;
(f) a flexible tube in hydraulic communication at one end with said ink through said second opening for receiving an amount of ink therefrom; and
(g) a controller operatively connected to said tester and to said valve for producing said first signal if said tester determines that said particular item is defective, and if a certain time interval expires without said tester determining any item defective.

9. A system for supplying a predetermined amount of fluid comprising:
(a) a reservoir enclosing said fluid and having a first and second openings;
(b) a gas supply producing gas under pressure;
(c) a vent providing a pressure at or slightly below ambient pressure;
(d) a valve pneumatically connected to said first opening, said gas supply, and said vent for selectively connecting said gas supply to said fluid in response to a first signal to expel an amount of said fluid through said second opening, and said vent to said fluid; and
(e) a controller connected to said valve and providing said first signal at a known duration selected from a plurality of durations to expel said predetermined amount of fluid.

10. A system for supplying a predetermined amount of fluid comprising:
(a) a reservoir enclosing said fluid and having a first and second openings;
(b) a gas supply providing gas under pressure;
(c) a vent providing a pressure at or slightly below ambient pressure;
(d) a pneumatic valve connected to said first opening, said vent, and said gas supply for selectively connecting said gas supply to said fluid for expelling an amount thereof through said second opening in response to a first signal and said vent to said fluid; and
(e) a controller connected to said valve and providing said first signal at one of a number of predetermined durations as selected utilizing time period from prior first signal.

* * * * *